United States Patent
Loeffler et al.

[19]

[11] Patent Number: 6,137,316
[45] Date of Patent: Oct. 24, 2000

[54] INTEGRATED CIRCUIT WITH IMPROVED OFF CHIP DRIVERS

[75] Inventors: Steffen Loeffler, Essex Junction, Vt.; Peter Poechmueller, Munich, Germany

[73] Assignee: Siemens Aktiengesellschaft, Munich, Germany

[21] Appl. No.: 09/093,797

[22] Filed: Jun. 9, 1998

[51] Int. Cl.$^7$ .............................................. H03K 19/0185
[52] U.S. Cl. ................................. 326/86; 326/17; 326/27; 326/101
[58] Field of Search .................................. 326/83, 86, 17, 326/101–103; 307/31–33; 323/353

[56] References Cited

U.S. PATENT DOCUMENTS

| | | | |
|---|---|---|---|
| 4,812,684 | 3/1989 | Yamagiwa et al. | |
| 5,198,699 | 3/1993 | Hashimoto et al. | 326/121 |
| 5,309,040 | 5/1994 | Nakano et al. | 323/353 |
| 5,428,311 | 6/1995 | McClure | 327/276 |
| 5,786,709 | 7/1998 | Kirsch et al. | 326/83 |
| 5,861,764 | 1/1999 | Singer et al. | 326/101 |

OTHER PUBLICATIONS

PCT Publication No. WO 96/41443, Dec. 19, 1996.

*Primary Examiner*—Jon Santamauro
*Attorney, Agent, or Firm*—Stanton C. Braden

[57] ABSTRACT

An array of multiple off chip drivers on an integrated circuit (IC) chip has reduced synchronous switching output timing error (TSSO) at high speeds of operation. The array includes a pair of low resistance buses to provide charge and discharge paths for the outputs, a plurality of terminals connecting the respective drivers between the buses, the resistance of each terminal being substantially greater than the resistance of either bus, and a plurality of capacitors connected internally of the respective drivers. Each driver has an input for receiving binary data from a memory unit and an output terminal which is switched in accordance with the binary input data to a higher or lower voltage level. There are a plurality of transistor switches within each driver which selectively couple a capacitor to the output terminal when it is driven high and at the same time couple another capacitor to one of the buses, and vice versa when the output terminal is driven low.

12 Claims, 3 Drawing Sheets

INTEGRATED CIRCUIT WITH IMPROVED OFF CHIP DRIVERS

FIELD OF THE INVENTION

This invention relates to improved circuitry and power bus connections thereof for multiple off chip drivers (OCDs) of an integrated circuit (IC) to enable these drivers to provide synchronized multiple binary output signals (ones, "1's", and zeros, "0's") from an electronic memory unit, such as dynamic random access memory (DRAM), with minimal synchronous switching output timing (TSSO) errors at very high clock rates.

BACKGROUND OF THE INVENTION

Dynamic random access memories (DRAMs) contain many millions of memory cells on a single integrated circuit (IC) chip and are capable of operating at very high clock rates. It is customary to provide on a separate integrated circuit an array of input receivers and output drivers to provide input binary signals to be stored in the memory and subsequently to output these binary signals to other circuitry as desired. In order to take full advantage of the high switching speed capability of a DRAM, the drivers, which are denoted as off chip drivers (OCDs), need to be capable of operating at very high clock rates, for example, at hundreds of megahertz.

Each of the off chip drivers on an IC chip, which itself is connected via pins and bond wires to other circuitry, is connected between at least two voltage supply buses on the chip which power the drivers. But because of physical constraints and space considerations in the layout of the drivers on the chip, some of the drivers are connected closer to the input ends of the voltage supply buses and other are connected much further away. Even though distances can be very short (e.g., a few millimeters or less), the inherent electrical inductances of the chip pins and bond wires and the electrical resistances of the buses become significant as clock rates are pushed higher and higher. Resistive voltage drops along a power supply bus from one driver to the next, and cumulatively along the length of a bus can become large enough to cause undesirable noise effects and troublesome differences in speeds or times of operation of the respective drivers on a circuit chip. These differences in speed are particularly marked when almost all of the off chip drivers are outputting binary "1's", for example, and only one or a few are outputting binary "0's" (or vice versa). As clock rates are pushed higher and higher in order to realize the full benefits of high speed DRAMs, the respective times of switching amongst previously known off chip drivers on a chip differ more and more and this results in greater and greater "TSSO" errors. Such a situation can seriously limit proper operation of a computer, for example. It is important therefore to eliminate, or at least significantly reduce such noise effects and timing errors.

It is thus desirable to reduce the above described problems of integrated circuit off chip drivers and thus to facilitate high speed operation.

SUMMARY OF THE INVENTION

The present invention, in one illustrative embodiment, is directed to an integrated circuit having multiple off chip drivers connected to a pair of short length, higher and lower voltage buses by respective pairs of terminals, each terminal being fabricated on the chip with a resistance considerably greater than the resistance of either voltage bus. The respective resistances of the terminals are substantially equal to each other. In a typical embodiment each driver comprises an n-channel and a p-channel field effect transistor with their gates connected in common to a binary data input and their drains connected in common to an output for corresponding binary data. The respective source of the p-channel transistors is coupled to a higher voltage bus and the source of the n-channel transistor is coupled to a lower voltage bus. A first capacitor, also fabricated on the IC chip is connected from the source of one transistor to the source of the other and serves along with the resistances of the pair of terminals connecting the driver to the buses to decouple to a considerable extent the operation of this driver from the operations of the other drivers on the chip. A second capacitor and a third capacitor are also fabricated on the chip along with switching means connected to them. Thus, for example, when the output is being driven positive by the driver the second capacitor, which had previously been charged from the higher voltage bus, is connected by the switching means to the output. At the same time this takes place, the third capacitor is connected by the switching means to the lower voltage bus and is pre-set with a lower voltage charge. When the output is next driven negative by the driver, the third capacitor is connected by the switching means to the output, and the second capacitor connected to the higher voltage bus and is pre-set with a higher voltage charge. This equal and opposite charging and discharging (and vice versa) of the second and third capacitors substantially reduces switching interactions and timing differences amongst the multiple off chip drivers. This permits reliable operation at higher speeds than would otherwise be possible.

From one aspect the present invention is directed to an integrated circuit comprising first and second power supply buses with a plurality of circuits coupled via conductors, which each have a resistance, between the first and second power supply buses. The resistance of each of the conductors between the circuits and the first power supply bus are essentially equal and are substantially greater than the resistance of the first power supply bus. The resistance of each of the conductors between the circuits and the second power supply bus are essentially equal and are substantially greater than the resistance of the second power supply bus.

From an other aspect, the present invention is directed to an integrated circuit comprising first and second power supply buses with a plurality of circuits coupled via conductors, which each have a resistance, between the first and second power supply buses. Each circuit comprises an input and an output and first and second capacitors. The first capacitor has a first terminal coupled between the output terminal of the circuit and a first terminal of the circuit which is coupled to a conductor which couples the circuit to the first power supply bus. The second capacitor has a first terminal coupled between the output terminal of the circuit and a second terminal of the circuit which is coupled to the conductor which couples the circuit to the second power supply bus.

From still an other aspect, the present invention is directed to an integrated circuit comprising first and second power supply buses with a plurality of circuits coupled via conductors, which each have a resistance, between the first and second power supply buses. The resistance of each of the conductors between the circuits and the first power supply bus is essentially equal and is substantially greater than the resistance of the first power supply bus. The resistance of each of the conductors between the circuits and the second power supply bus is essentially equal and is substantially greater than the resistance of the second power supply bus. Each circuit comprises an input and an output and first and second capacitors. The first capacitor has a first terminal coupled between the output terminal of the circuit and a first terminal of the circuit which is coupled to a conductor which couples the circuit to the first power supply bus. The second capacitor has a first terminal coupled between the output terminal of the circuit and a second terminal of the circuit which is coupled to the conductor which couples the circuit to the second power supply bus.

A better understanding of the invention together with a fuller appreciation of its many advantages will best be gained from a study of the following description and claims given in conjunction with the accompanying drawings.

DETAILED DESCRIPTION

Figure 1:
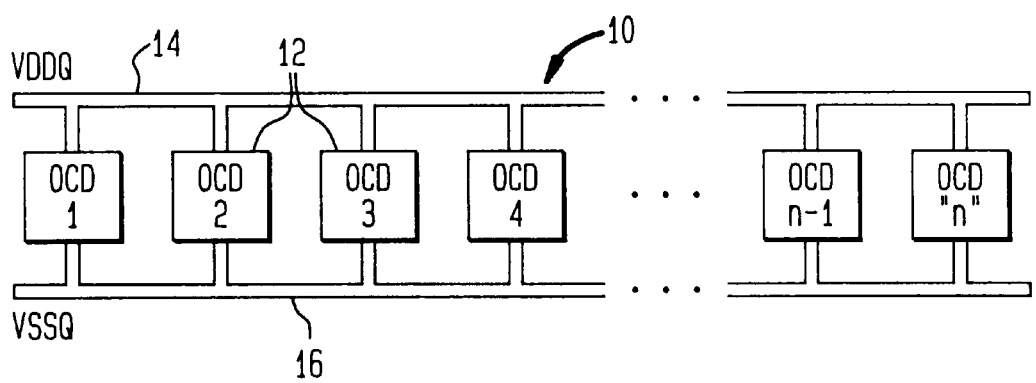
FIG. 1 is a schematic illustration of a prior art array of multiple off chip drivers as fabricated on an IC chip.

Referring now to FIG. 1, there is shown a schematic representation of a conventional (prior art) array 10 of multiple off chip drivers (OCDs) 12 (numbered "1" to "n") fabricated on an integrated circuit (IC) chip (not shown). An associated memory unit (e.g., DRAM) is also not shown but as is well known in the art, is interconnected to the respective drivers 12. Each of the drivers 12 is connected directly between a pair of local voltage supply buses 14 and 16 which are labeled VDDQ and VSSQ respectively. Off chip driver number OCD "1" is connected closest to the input or source end of the buses 14 and 16 and off chip driver "n" is connected at the far or right end of these buses. Each bus 14 and 16 has an resistance comprised primarily of resistance per unit length, the values of which though small are cumulative along the lengths of the buses 14 and 16. The buses 14 and 16, for example, are of aluminum and are fifty (50) microns in width.

Figure 2:
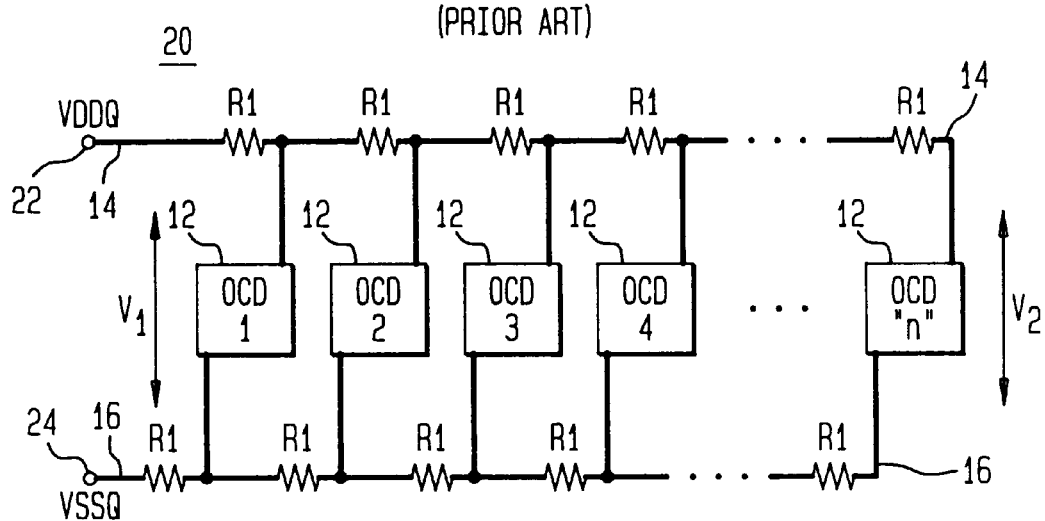
FIG. 2 is a schematic circuit diagram of the off chip driver array of FIG. 1.

Referring now to FIG. 2, there is shown a schematic circuit diagram 20 of the driver array 10 (FIG. 1), each driver 12 (numbered "1" to "n") being connected between the buses 14 and 16. The bus 14 has an input terminal 22 and the bus 16 an input terminal 24, which terminals are connected respectively to main voltage supply buses (not shown). The first driver 12, numbered off chip driver OCD "1", is connected to the buses 14 and 16 closely adjacent to the input terminals 22 and 24. The short lengths of the buses 14 and 16 between the terminals 22 and 24 and the driver OCD "1" have respective resistances R1 corresponding to these short lengths of the buses. Similarly, the short lengths of the buses between successive drivers 12 (e.g., from driver OCD "1" to driver OCD "2", and so on) have similar resistances 26 (R1), these resistances R1 being cumulative to the last driver OCD "n". By way of example, there may be twenty drivers 12 (n=20) on the IC chip. Thus during high speed operation of the multiple drivers 12 a supply voltage "$V_2$" as seen by the last driver OCD "n" can be somewhat different from a supply voltage "$V_1$" as seen by the first driver OCD "1". This condition, caused by the voltage drops due to the resistances R1, causes undesirable synchronous switching output timing (TSSO) errors amongst the various drivers 12 as rates of operation are pushed high enough to realize the full benefits of state-of-the-art memories (e.g., present day DRAMs).

Figure 3:
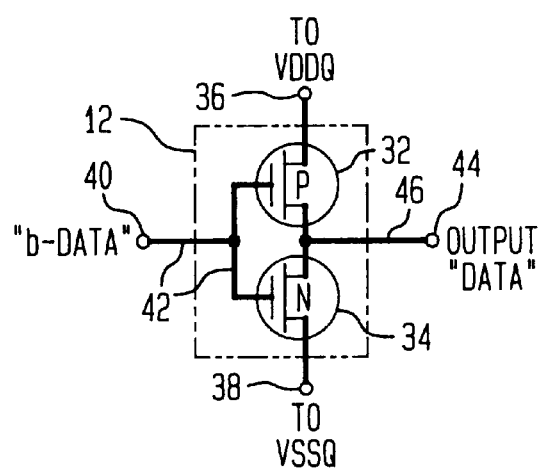
FIG. 3 is a schematic circuit diagram of one of the prior art off chip drivers.

Referring now to FIG. 3, there is shown a well known schematic circuit diagram of one of the drivers 12 (shown here within a dashed line rectangle). The driver 12 comprises a p-channel field effect transistor and an n-channel field effect transistor 34 connected serially between a first supply voltage terminal 36 and a second supply voltage terminal 38. Driver 12 is typically denoted as a CMOS inverter circuit. A terminal 36 is connected to the supply bus 14 (shown only in FIG. 2) at some point along its length, and the terminal 38 to the bus 16 (shown only in FIG. 2) at some point along its length. While not shown here, but shown in FIG. 2, there are one or more of the resistances R1 connected between these terminals 36 and 38 and the respective buses 14 and 16, depending on position of the driver 12 from left to right along these buses 14 and 16 and the number ("1" to "n") of the particular driver 12. The resistive values of each of the R1's can vary.

The gates of transistors 32 and 34 are coupled together to an input terminal 40 to which an input signal denoted a "b-data" is applied during operation of the driver 12. The drains of transistors 32 and 34 are coupled together to an output terminal 44 at which an output signal denoted as "OUTPUT DATA" is generated during operation of driver 12. When an input signal (a binary "1" or a binary "0") is applied to its input terminal 40, driver 12 generates at output terminal 44 a signal which is the logical inversion of that applied to input terminal 40. But, as will be explained in greater detail hereinafter, a given driver 12, depending on its position along the length of the buses 14 and 16 and on how many of the resistances R1 (see FIG. 2) are in circuit with that driver 12, may reach its specified output signal levels to its respective output terminal 44 sooner or later than do other drivers 12 in the array 10 in switching signals onto their outputs. This can result in timing errors in circuitry coupled to the drivers 12.

Figure 4:
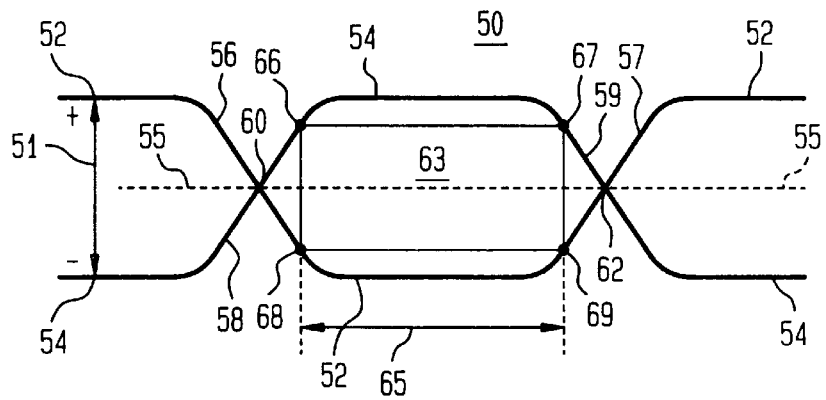
FIG. 4 is a graph schematically illustrating ideal timing conditions for multiple off chip drivers.

Referring now to FIG. 4, there is shown an idealized graph 50 with horizontal direction representing time and vertical direction representing positive and negative amplitude voltage indicated by a double beaded arrow 51. The graph 50 represents the timing of output signals of the multiple off chip drivers 12 under ideal, not actual conditions. The graph 50 schematically illustrates a first alternating timing wave 52 and a second alternating timing wave 54, these waves being vertically symmetrical about a horizontal dashed-line axis 55 with amplitudes as indicated. The wave 52 has a negative going or downward sloping edge 56 and a positive going upward sloping edge 57. And similarly the wave 54 has a positive going upward sloping edge 58, and a negative going downward sloping edge 59. The sloping edges 56 and 58 intersect each other and the horizontal axis 55 at a common point 60, and the sloping edges 57 and 59 intersect each other and the horizontal axis 55 at a common point 62. The sloping edges 56, 57, 58 and 59 (sloping rather than vertical) illustrate that in an actual driver circuit (such as in FIG. 3) a finite time is required for the output signal to go from low amplitude to high (or vice versa). As seen here the waves 52 and 54 are synchronous in time with each other since they intersect each other and the horizontal axis 55 at the common points 60 and 62. As will be further explained hereinafter, this time synchronization of the waves 52 and 54 is, in effect, skewed or degraded because the drivers 12 actually reach their output levels ("1's" and/or "0's") at different instants. These differences in timing result from differing supply voltages to the multiple drivers 12 in turn resulting from the resistances R1 in the supply buses 14 and 16, as was previously explained.

In the idealized case illustrated in FIG. 4, there is a time window 63 during which each of the multiple drivers 12 (see FIG. 1) is able to switch onto its output terminal 44 (FIG. 3) a signal corresponding to a binary signal (either "1" or "0") occurring at its input 40. The window 63 may be thought of as representing an idealized interval of time during which all of the binary signals ("1's" and "0's") on the outputs 44 of the multiple drivers 12 occur simultaneously in parallel at the same instant and have the same duration. This ideal condition gives as much time as possible (for a given clock rate) for these signals to be properly recognized by the circuits to which they are applied. But in fact, as was explained above, some of the drivers 12 in an actual array 10 (FIG. 1) will generate correct output signals later and others sooner relative to each other. This skewing in the times of switching of the drivers 12 in effect shortens to a greater or less extent the duration of the idealized window 63. This shortening of the window should be minimized to the extent possible in order to facilitate high speed operation.

The window 63 has a time duration indicated at 65. The window 63 is defined by its four corners indicated by points 66, 67, 68 and 69 on the respective sloping edges 56, 57, 58 and 59 of the waves 52 and 54. The points 66, 67, 68 and 69 are all approximately at the 90% amplitude levels of the respective waves 52 and 54, such levels being normally considered as those at which switching of a driver 12 is completed. It should be noted that the duration 65 of the window 63, even with the idealized condition of synchronization illustrated in FIG. 4, is substantially less than the time interval between the points 60 and 62. Thus for example, for a clock rate of 500 megahertz, the time interval between the points 60 and 62 (representing one-half clock cycle) is only one nanosecond (1 ns), and the duration 65 of the window 63 is substantially less than a nanosecond. Therefore even small amounts of skewing (measured in fractions of a nanosecond) in the synchronized switching of the drivers 12 can appreciably narrow in time the window 63 and result in TSSO errors. The present invention significantly reduces this problem, as will now be explained.

Figure 5:
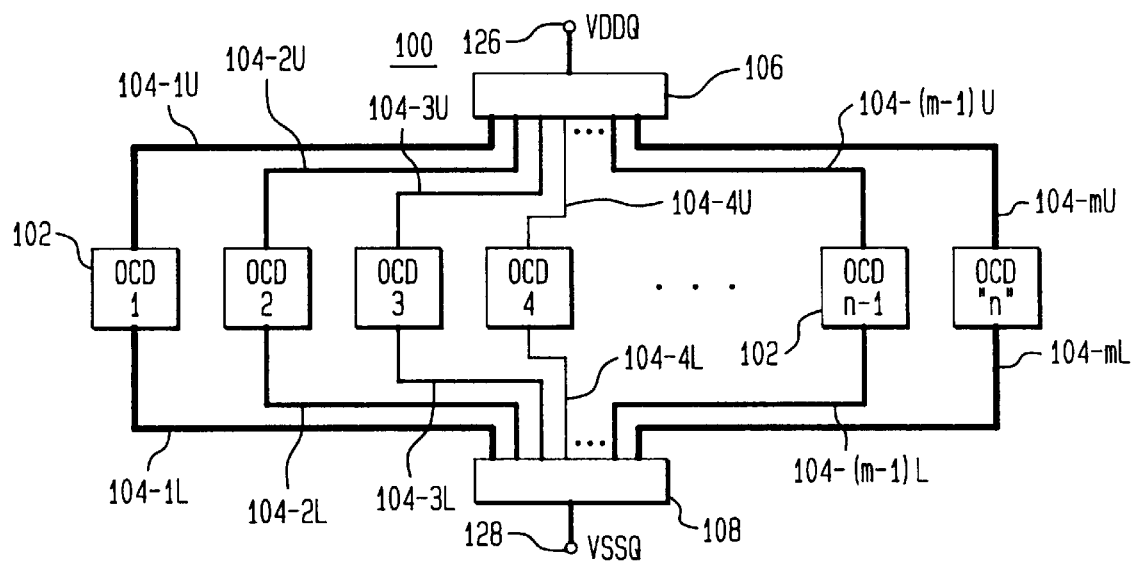
FIG. 5 is a block diagram of an array of multiple off chip drivers fabricated on an IC chip in accordance with the present invention.

Referring now to FIG. 5, there is shown an array 100 of multiple off chip drivers 102 (numbered respectively "1" to "n") coupled between power supply buses 106 and 108 in accordance with the present invention. Array 100 and power supply buses 106 and 108 are typically formed as part of an integrated circuit (not shown) which comprises a plurality of circuitry that is coupled to the off chip drivers. Each off chip driver has an input and an output but for simplicity same are not shown in FIG. 5. Each driver 102 at its position on the IC chip is connected by one of terminals 104-1U through 104-nU (upper 104 terminals) to power supply bus 106 and by one of terminals 104-1L through 104-nL (lower 104 terminals) to a power supply bus 108. The power supply buses 106 and 108 are shown coupled to terminals 126 and 128, respectively, to which are coupled voltage sources (not shown) providing output voltage levels of VDDQ and VSSQ, respectively. Each of the upper 104 terminals are fabricated with an appropriate length and width by well known techniques so that the respective resistances of these terminals are all essentially equal to each other. Each of the lower 104 terminals are fabricated with an appropriate length and width by well known techniques so that the respective resistances of these terminals are all essentially equal to each other. The bus 106 is designed such that the resistance thereof is much smaller (typically by about an order of magnitude or even smaller) than the resistances of each of the upper 104 terminals. The bus 108 is designed such that the resistance thereof is much smaller (typically by about an order of magnitude or smaller) than the resistances of each of the lower 104 terminals.

Figure 6:
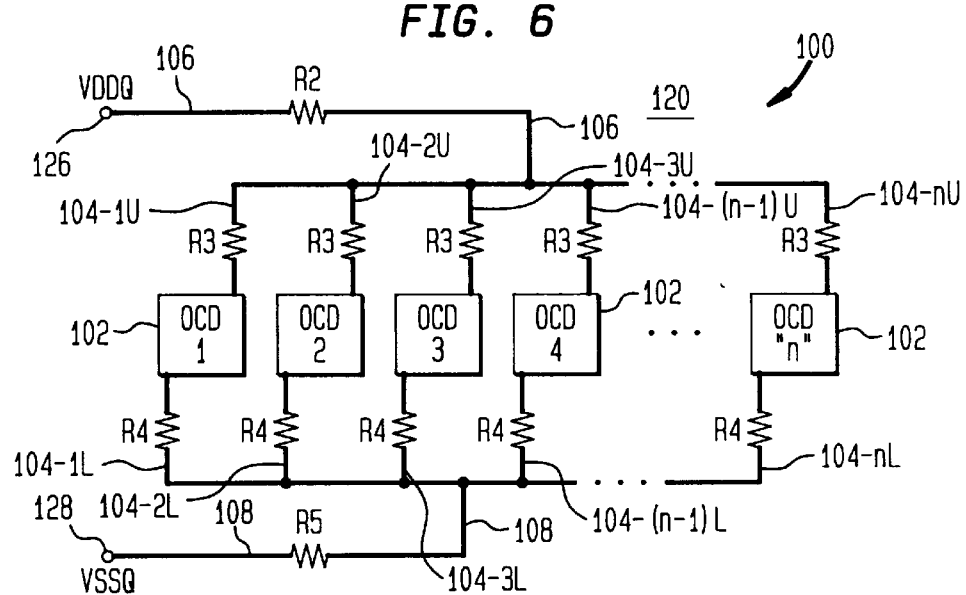
FIG. 6 is a partial schematic circuit and block diagram of multiple off chip drivers of the array of FIG. 5 provided in accordance with the present invention.

Referring now to FIG. 6, there is shown a schematic and circuit diagram 120 of the driver array 100 (FIG. 5) in accordance with the present invention. Each of the off chip drivers 102 ("1" to "n") is shown connected to bus 106 through the terminals 104-1U through 104-nU (the upper 104 terminals) and to bus 108 through terminals 104-1L through 104-nL (the lower 104 terminals). Each of the upper 104 terminals has a resistance R3 and the bus 106 has a resistance R2. The resistances R3 are all essentially equal to one another, as was mentioned previously, and each is substantially greater than the resistance R2 of bus 106, the latter being relatively small because of the short length of the bus 106. Each of the lower 104 terminals has a resistance R4 and the bus 108 has a resistance R5. The resistances R4 are all essentially equal to one another, as was mentioned previously, and each is substantially greater than the resistance R5, the latter being relatively small because of the short length of the bus 108. The buses 106 and 108 are coupled at respective terminals 126 and 128 to voltage sources (supplies) having voltage levels VDDG and VSSQ, respectively. As will be further explained hereinafter, the resistances R3 and R4 inserted according to one aspect of the invention in series with the off chip drivers 102 and the buses 106 and 108 help in substantially reducing noise and other undesirable interactions amongst the multiple drivers 102 during operation.

Figure 7:
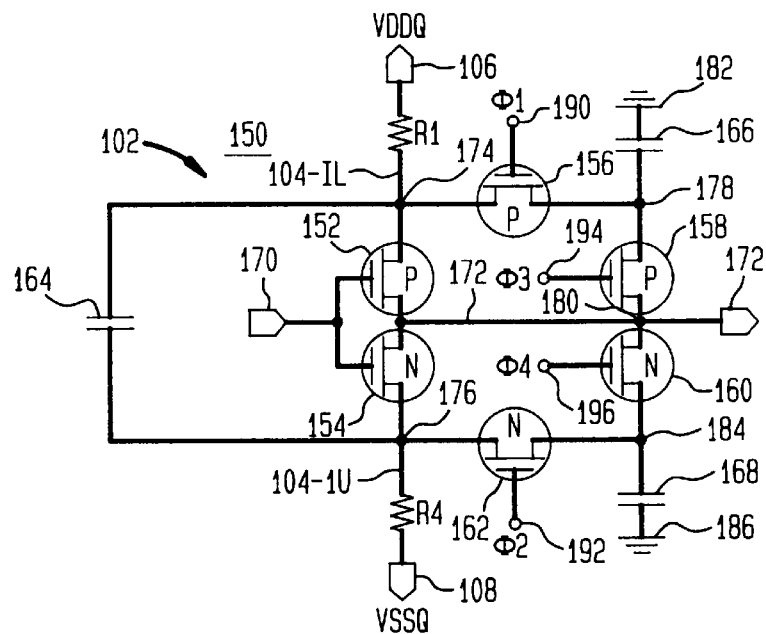
FIG. 7 is an illustrative circuit diagram of an off chip driver in accordance with the present invention.

Referring now to FIG. 7, there is shown a circuit 150 in accordance with the present invention. Circuit 150 is a preferred embodiment of off chip driver 102 of FIGS. 5 and 6. Circuit 150 comprises p-channel field effect transistors 152, 156, and 158, n-channel field effect transistors 154, 160, 162, and capacitors 164, 166, and 168.

The gates of the transistors 152 and 154 are connected together to an input terminal 170 to which binary signals ("b-Data") from a memory (not shown) are applied. The drains of the transistors 152, 154, 158, and 160 are connected together and to a common output terminal 172 ("Data"). The transistor 152 has its source connected via a terminal 104-1L and its associated resistance R3 to the bus 106 and a voltage source VDDQ. Because the resistance R2 (See FIG. 6) of the bus 106 is so small relative to R3, the former can be neglected and is not shown. In similar fashion, the transistor 154 has its source connected via another terminal 104-1U and its associated resistance R4 (see FIG. 6) to the bus 108 and voltage source VSSQ. The resistance R5 (shown in FIG. 6) of the bus 108 is small compared to that of resistance R4 and is not shown since it can be neglected.

A first terminal of capacitor 164 is coupled the sources of transistors 152 and 156, and to a terminal 174. A second terminal of capacitor 164 is coupled to the drains of transistors 154 and 162 and to a terminal 176. The sources of transistors 160 and 162 are coupled to a first terminal of capacitor 168 and to a terminal 184. The sources of transistors 156 and 158 are coupled to a first terminal of capacitor 166 and to a terminal 178. Second terminals of capacitors 166 and 168 are coupled to a reference voltage which is typically ground when the voltage applied to bus 106 is positive and the voltage applied to bus 108 is negative. The gate of transistor 156 is coupled to a terminal 190 to which is applied a signal Ô1. The gate of transistor 158 is coupled to a terminal 194 to which is applied a signal Ô3. The gate of transistor 160 is coupled to a terminal 196 to which is applied a signal Ô4. The gate of transistor 162 is coupled to a terminal 192 to which is applied a signal Ô2.

When the input terminal 170 receives a binary signal ("b-Data"), a corresponding output signal (but reversed in phase) is generated on the output terminal 172 ("Data"), as is well known in the art. The provision in the circuit 150 of each driver 102 of the capacitor 164 and the respective resistances R3 and R4 in series with it and with the buses 106 and 108 provides a considerable degree of decoupling amongst the multiple drivers 102 of the array 100 (FIGS. 5 and 6) when they begin switching and thus helps reduce unwanted interactions and noise interference. In addition, as will now to be explained, the capacitors 166 and 168 are selectively connected in circuit during a switching operation of each respective driver 102 to further reduce these effects.

Figure 8:
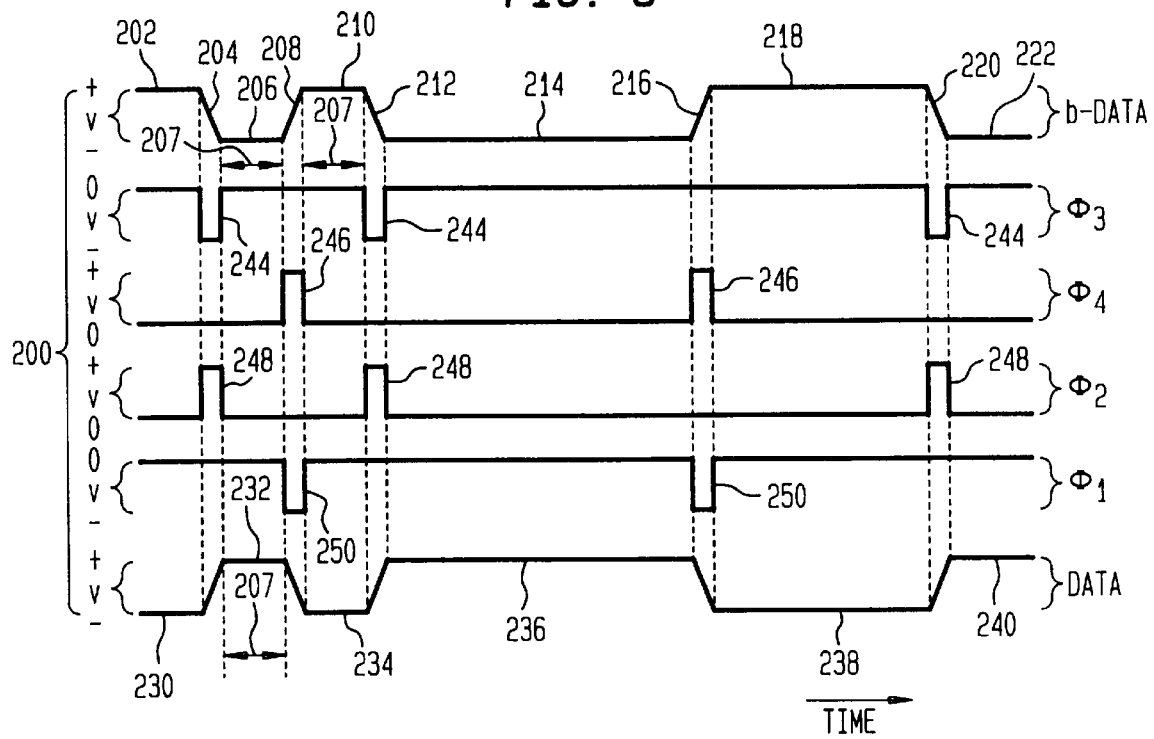
FIG. 8 is a graph schematically illustrating various signals and their time relationship pertaining to the off chip driver of FIG. 7.

Referring now to FIG. 8, there is shown by way of example a graph 200 schematically illustrating related signals, here designated "b-Data", Ô$_3$, Ô$_4$, Ô$_2$, Ô$_1$, and "Data", pertaining to each driver 102. The horizontal axis of the graph 200 represents time and the vertical axis, respective voltages (not to scale) of the signals with relative polarities as indicated. By way of simplifying the following explanation, it is assumed that the higher and lower voltages VDDQ and VSSQ applied respectively to the buses 106 and 108 are referenced to ground at zero volts, that is, the midpoint of the voltage difference between the higher and lower buses is held at ground potential (zero volts).

The signal "b-Data", as illustrated in the graph 200, is applied to the input terminal 170 of the driver 102 (FIG. 7), the signal "Data" is generated on the output terminal 172, the signal Ô$_3$ is applied to the terminal 194, the signal Ô$_4$ is applied to the terminal 196, the signal Ô$_2$ is applied to the terminal 192, and the signal Ô$_1$ is applied to the terminal 190. These respective signals are related in time as indicated in the graph 200 by the vertical dashed lines.

The signal "b-Data" is shown here by way of example as having a level (+V) 202 which then falls along a negative going edge 204 to a level (−V) 206 which has a duration indicated at 207. This interval 207 represents the duration of a binary signal applied to the input terminal 170 from a memory (not shown) and is equivalent to the duration 65 of the window 63 (FIG. 4). It is to be understood that the respective binary signals inputted to others of the drivers 102 in the array 10 may be different in sequence of "1's" and "0's" from those shown in the graph 200.

The "b-Data" signal rises from the level 206 along a positive going edge 208 to another positive level 210 and then after another interval 207 falls along a negative going edge 212 to a level 214. In the illustration here, the "b-Data" signal remains at the level 214 for a number (not explicitly shown) of the intervals 207 indicating that during this extended time binary "1's" are continuously being applied to the input 170 of the driver 102. Thereafter, the level 214 rises along a positive going edge 216 to a level 218 (binary "0"). The "b-Data" signal (in the illustration here) remains at the level 218 for several intervals 207 and then falls along a negative going edge 220 to a level 222 (binary "1"). The "b-Data" signal, along with the other signals, is not shown beyond the right and left sides of the graph 200.

The level 202 of the "b-Data" signal applied to the input 170 to the driver 102 results in a level 230 "Data" signal being generated on the output terminal 172. Similarly, the "b-Data" levels 206, 210, 214, 218 and 222 result in corresponding levels 232, 234, 236, 238 and 240 in the "Data" signal.

During each switching operation of the driver 102, that is, when its input 170 is driven to a level (e.g., the "b-Data" level 206) and its output 172 switched to a level (e.g., the "Data" level 232), or vice versa, the capacitors 166 and 168 are selectively (and momentarily) connected to the output terminal 172 ("Data") by turning on the transistor 158 or the transistor 160. This selective connecting to the terminal 172 is accomplished by the signal Ô$_3$ applied to the terminal 194 of the transistor 158, or by the signal Ô$_4$ applied to the terminal 196 of the transistor 160.

As will be explained shortly, the capacitor 166, before being momentarily connected by the signal Ô$_3$ and the transistor 158 to the output terminal 172, has been pre-set or conditioned with an electric charge. Thus for a brief instant during which the capacitor 166 is so connected to the terminal 172, the energy then stored in the capacitor 166 helps, along with power drawn from the buses 106 and 108, to drive the output terminal 172 to a level (e.g., the level 232 of the "Data" signal). A corresponding effect takes place when the capacitor 168 (also pre-set) is connected momentarily to the terminal 172 when the latter is being driven by the driver 102 to negative level (e.g., the "Data" level 234).

The timing of the Ô$_3$ signal relative to the "b-Data" signal is illustrated in the graph 200. During each negative going edge 204, 212, 220 of the "b-Data" signal, a short duration pulse 244 is generated as the Ô$_3$ signal. Each such pulse 244 in turn momentarily switches on the transistor 158 thereby connecting the capacitor 166 to the output terminal 172. Similarly, during each edge 208, 216 of the "b-Data" signal a short duration, positive going pulse 246 is generated as the Ô$_4$ signal. Each such pulse 246 in turn momentarily switches on the transistor 160 thereby connecting the capacitor 168 to the output terminal 172. The pre-set negative charge on the capacitor 168 helps drive the terminal 172 to a level (e.g., the "Data" level 234).

It will be seen in the graph 200 that the signal Ô$_2$ has a positive going pulse 248 occurring in time along with each negative going pulse 244 of the Ô$_3$ signal. Similarly, The Ô$_1$ signal has a negative going pulse 250 occurring in time with each positive going pulse 246 of the Ô$_4$ signal. Thus, when a Ô$_3$ pulse 244 occurs and the transistor 158 is turned on thereby connecting the capacitor 166 to the terminal 172, as was previously explained, a Ô$_2$ pulse 248 turns on the transistor 162 thereby connecting the capacitor 168 through the resistor R4 to the bus 108 to which VSSQ is applied. This puts a negative charge on the capacitor 168 and conditions or resets it for the next time that the output terminal 172 is driven to the "Data" level 234. Thus, while the capacitor 166 is helping pull the output terminal 172 to a level (e.g., "Data" level 232), the capacitor 168 is being charged and is thus pre-set or ready to be connected to the output terminal 172 when the driver 102 switches the latter again to a "Data" level 234, as was explained previously. In similar fashion, the capacitor 166 is recharged from the VDDQ bus 106 through the resistor R3 and the transistor 156 by a $\dot{O}_1$ pulse 250 at the same time that the capacitor 168 is connected through the transistor 160 to the terminal 172 as it is being driven to the "Data" level 234. This equal and opposite charging and discharging (and vice versa) of the capacitors 166 and 168 substantially reduces switching interactions and timing differences amongst the multiple drivers 102 of the array 100. This permits reliable operation at higher speeds than would otherwise be possible. Circuits for generating the signals $\dot{O}_1$, $\dot{O}_2$, $\dot{O}_3$, and $\dot{O}_4$ are well known in the art and are not shown. The capacitors 164, 166 and 168 are easily fabricated by known techniques. These capacitors can, for example, be a field effect transistor with the gate serving as one terminal and the drain and source coupled together and serving as a second terminal. Another possible capacitor is simply a conductor separated from a semiconductor region by an insulator such as silicon dioxide. In an illustrative example, each of resistances R3 and R4 are about 10 ohms, resistances R2 and R5 are about 0.3 ohms each and capacitors 164, 166, and 168 are each about 150 picofarads.

The above description is intended in illustration and not in limitation of the invention. Various changes in the driver and array of the invention as described above and as shown in the drawings may occur to those skilled in the art, and these changes may be made without departing from the spirit or scope of the invention as set forth in the accompanying claims. For example, the invention is not limited to a given number of drivers in an array, or to particular values of terminal resistance, or values of capacitance, or a particular frequency of operation.

What is claimed is:

1. An integrated circuit comprising:
   first and second power supply buses with a plurality of circuits coupled via conductors, which each have a resistance, between the first and second power supply buses;
   the resistance of each of the conductors between the circuits and the first power supply bus being essentially equal and being substantially greater than the resistance of the first power supply bus; and
   the resistance of each of the conductors between the circuits and the second power supply bus being essentially equal and being substantially greater than the resistance of the second power supply bus.

2. The integrated circuit of claim 1 wherein each circuit has an input terminal and an output terminal and each circuit further comprises:
   a first capacitor having a first terminal coupled between the output terminal of the circuit and a first terminal of the circuit which is coupled to the conductor which couples the circuit to the first power supply bus; and
   a second capacitor having a first terminal coupled between the output terminal of the circuit and a second terminal of the circuit which is coupled to the conductor which couples the circuit to the second power supply bus.

3. The integrated circuit of claim 2 wherein each first capacitor is coupled to the first terminal by a first switching device and is coupled to the output terminal by a second switching device, and each second capacitor is coupled to the second terminal by a third switching device and is coupled to the output terminal by a fourth switching device.

4. The integrated circuit of claim 3 wherein each circuit further comprises a third capacitor having a first terminal coupled to the first terminal of the circuit and having a second terminal coupled to the second terminal of the circuit.

5. The integrated circuit of claim 1 wherein each circuit further comprises a third capacitor having a first terminal coupled to the first terminal of the circuit and having a second terminal coupled to the second terminal of the circuit.

6. The integrated circuit of claim 3 wherein each of the switching devices is a transistor.

7. The integrated circuit of claim 6 wherein each transistor is an field effect transistor having first and second output terminals and a gate terminal.

8. The integrated circuit of claim 6 wherein each of the plurality of circuits is an input-output driver.

9. The integrated circuit of claim 8 wherein each input-output driver is an inverter.

10. The integrated circuit of claim 9 wherein each inverter comprises a p-channel field effect transistor serially coupled to an n-channel field effect transistor.

11. The integrated circuit of claim 9 wherein all transistors are insulated gate field effect transistors.

12. An integrated circuit comprising:
   first and second power supply buses with a plurality of circuits coupled via conductors, which each have a resistance, between the first and second power supply buses;
   the resistance of each of the conductors between the circuits and the first power supply bus being essentially equal and being substantially greater than the resistance of the first power supply bus;
   the resistance of each of the conductors between the circuits and the second power supply bus being essentially equal and being substantially greater than the resistance of the second power supply bus; and
   each circuit comprising:
      an input and an output;
      a first capacitor having a first terminal coupled between the output terminal of the circuit and a first terminal of the circuit which is coupled to a conductor which couples the circuit to the first power supply bus; and
      a second capacitor having a first terminal coupled between the output terminal of the circuit and a second terminal of the circuit which is coupled to the conductor which couples the circuit to the second power supply bus.

* * * * *